(12) United States Patent
Goruganthu et al.

(10) Patent No.: US 6,281,029 B1
(45) Date of Patent: Aug. 28, 2001

(54) PROBE POINTS FOR HEAT DISSIPATION DURING TESTING OF FLIP CHIP IC

(75) Inventors: Rama R. Goruganthu; Jeffrey D. Birdsley; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,977

(22) Filed: Sep. 30, 1999

(51) Int. Cl.[7] ................................................. H01L 21/66
(52) U.S. Cl. ............................................................ 438/18
(58) Field of Search ........................ 438/4, 14, 15, 438/17, 18, 108, 977; 257/48, 621, 622, 774, 778; 250/307, 309, 491.1, 492.2, 492.21

(56) References Cited

U.S. PATENT DOCUMENTS 5,821,549 * 10/1998 Talbot et al. ...................... 250/307
5,990,562 * 11/1999 Vallett ................................ 257/774

* cited by examiner

Primary Examiner—Keith Christianson

(57) ABSTRACT

According to one aspect of the disclosure, the present invention provides methods and arrangements for testing a flip chip semiconductor device after the back side of the chip has been thinned to expose a selected region in the substrate. For some chips, thinning removes substrate material useful for drawing heat away from the internal circuitry when the circuitry is running at high speeds. To compensate for this material loss, as plurality of thermally conductive elements is formed in the backside of the semiconductor to draw heat from the backside of the device when the semiconductor device is activated.

21 Claims, 3 Drawing Sheets

PROBE POINTS FOR HEAT DISSIPATION DURING TESTING OF FLIP CHIP IC

RELATED PATENT DOCUMENTS

The present application is related to co-pending patent documents identified by patent application Ser. No. 09/383,790, Ring et al., filed on Aug. 26, 1999, entitled "ARRANGEMENT AND METHOD FOR CHARACTERIZATION OF FIB INSULATOR DEPOSITION"; patent application Ser. No. 09/247,002, filed on Feb. 8, 1999, entitled "TEST ARRANGEMENT AND METHOD FOR A THINNED FLIP CHIP IC"; patent application Ser. No. 09/409,989, filed on Sep. 30, 1999, entitled "PROBE GRID FOR INTEGRATED CIRCUIT ANALYSIS"; and patent application Ser. No. 09/409,089, filed on Sep. 30, 1999, entitled "PROBE GRID FOR INTEGRATED CIRCUIT EXCITATION" which are assigned to the assignee of the present invention and are incorporated herein by reference.

FIELD OF THE INVENTION

The invention relates to semiconductor device assemblies, and more particularly to techniques for analyzing and debugging circuitry as may be applied, for example, to a flip-chip bonded integrated circuit.

BACKGROUND OF THE INVENTION

In recent years, the semiconductor industry has seen tremendous advances in technology, which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past, the die and package were first attached and then the electrical connections from the die to the package were made by wire bonding. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks, and be at a safe distance from neighboring lead wires.

To increase the number of pad sites available for a die and to address other problems, a different chip packaging technique called controlled collapse chip connection or flip chip packaging is being adopted. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are commonly called flip chips in the industry. Each bump connects to a corresponding package inner lead. The packages that result are lower profile and have lower electrical resistance and a shortened electrical path. The output terminals of the package may be ball-shaped conductive bump contacts (usually solder, or other similar conductive material) are typically disposed in a rectangular array. These packages are occasionally referred to as "Ball Grid Array" (BGA). Alternatively, the output terminals of the package may be pins, and such a package is commonly known as pin grid array (PGA) package.

Once the die is attached to the package, the back side portion of the die remains exposed. The transistors and other circuitry are generally formed in a very thin epitaxially grown silicon layer on a single crystal silicon wafer of which the die is singulated from. The side of the die including the epitaxial layer containing the transistors and the other active circuitry is often referred to as the circuit side of the die or front side of the die. The circuit side of the die is positioned very near the package. The circuit side opposes the back side of the die. Between the back side and the circuit side of the die is single crystalline silicon. The positioning of the circuit side provides many of the advantages of the flip chip. However, in some instances the orientation of the die with the circuit side face down on a substrate may be a disadvantage or present new challenges. When a circuit fails, when circuit testing is desired, or when it is necessary to modify a particular chip, access to the transistors and circuitry near the circuit side is obtained only from the back side of the chip. This is challenging since the transistors are in a very thin layer (about 10 micrometers) of silicon buried under the bulk silicon (greater than 500 micrometers). Thus, the circuit side of the flip chip die is not visible or accessible for viewing using optical or scanning electron microscopy.

Although the circuit of the integrated circuit (IC) is buried under the bulk silicon, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. On a die that is 725 microns thick, this means removing at least 625 microns of silicon before IR microscopy can be used. Thinning the die for failure analysis of a flip chip bonded IC is usually accomplished in two or three steps. First, the die is thinned across the whole die surface. This is also referred to as global thinning. Global thinning is done to allow viewing of the active circuit from the back side of the die using IR microscopy. Mechanical polishing is one method for global thinning.

Once an area is identified as an area of interest and it is determined that access is needed to a particular area of the circuit, local thinning techniques can be used to thin an area smaller than the die size. Laser microchemical etching of silicon is one method of local thinning.

Sometimes it is necessary for failure analysis, or for design debug, after global and/or local thinning, to make electrical contact and probe certain nodes in the circuit. This testing can be performed via the thinned back side or via pads on the circuit side of the chip. When testing via pads on the circuit side of the chip, the chip is typically placed in a test fixture having a circuit connector arranged to connect to these circuit-side pads. The chip is activated through the test fixture, and signals at the nodes are analyzed. For certain applications, it has been discovered in connection with the present invention that the above-described thinning to remove substrate material results in the circuitry overheating. When there is insufficient substrate material for drawing heat away from the internal circuitry, for example, when the circuitry is running at high speeds, the internal circuitry overheats and becomes inoperative. Consequently, the analysis/debug efforts are destroyed.

Accordingly, there is a need for a testing approach that overcomes the above-mentioned shortcomings.

SUMMARY OF THE INVENTION

According to one aspect of the disclosure, the present invention provides an approach for testing a flip chip semiconductor device after the back side of the chip has been thinned to expose a selected region in the substrate. Thinning removes substrate material useful for drawing heat away from the internal circuitry when the circuitry is running at high speeds. To compensate for this material loss, a plurality of thermally conductive elements are formed in the backside of the semiconductor to draw heat from the backside of the device when the semiconductor device is activated.

In one example embodiment, the present invention is directed to a method for testing a semiconductor device having a circuit side and a back side. The method includes thinning the semiconductor device and exposing a selected region in the semiconductor device at its backside. A plurality of thermally conductive elements is then formed in the backside of the semiconductor device to facilitate testing via its circuit side. The semiconductor device is then activated and uses the thermally conductive elements to dissipate heat generated by the semiconductor device during testing.

In another example embodiment, the present invention is directed to an arrangement for testing a semiconductor device having a circuit side and a backside. The test arrangement includes a mechanism for securing and testing the semiconductor device via the circuit side of the semiconductor device. The arrangement also includes a mechanism for conducting heat generated by the semiconductor device while activated, the conducting mechanism being formed in the semiconductor device, wherein the mechanism for securing and testing is adapted to test the semiconductor device while the semiconductor device is activated.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description can best be understood when read in conjunction with the following drawings, in which.

Figure 1:
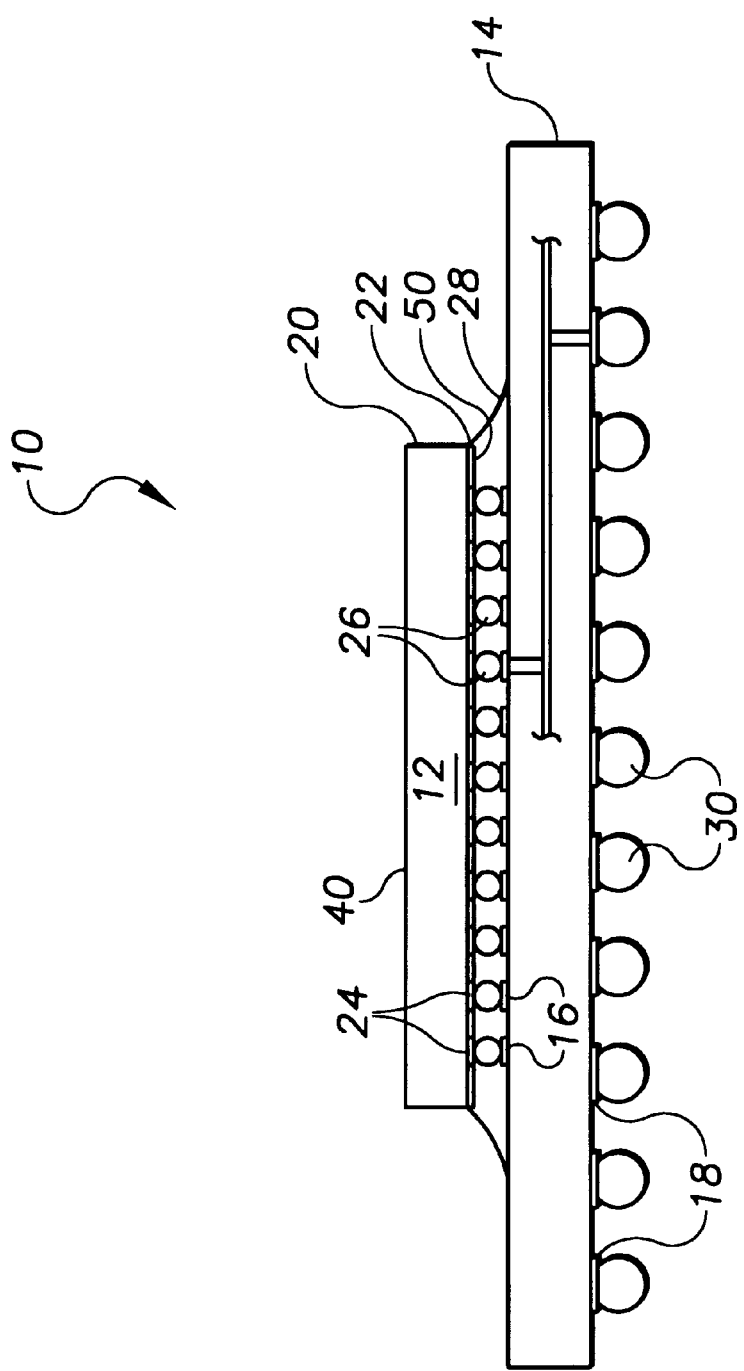
FIG. 1 shows a side view of a conventional flip chip packaged integrated circuit.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip type circuit packages. While the present invention is not limited to flip-chip type circuit packages, an appreciation of various aspects of the invention is best gained through a discussion of various examples using this application.

According to a particular embodiment of the present invention, a conventional flip chip type die is tested by first thinning the back side of the die to expose a selected region over suspect circuitry. This suspect circuitry may be analyzed using microscopy techniques or even modified after local thinning. Regardless of how or whether the suspect circuitry is analyzed from the backside of the die, once thinned the die has a plurality of thermally conductive elements formed in the backside of the semiconductor device to facilitate testing via its circuit side. The semiconductor device is then activated while using the thermally conductive elements to dissipate heat generated by the semiconductor device during testing.

In another example embodiment, a test arrangement for a semiconductor device is described having a circuit side and a back side and includes a mechanism for securing and testing the semiconductor device via the circuit side of the semiconductor device. The arrangement also includes a mechanism for conducting heat generated by the semiconductor device while activated, the conducting mechanism being formed in the semiconductor device, and wherein the mechanism for securing and testing is adapted to test the semiconductor device while the semiconductor device is activated.

FIG. 1 shows a side view 10 of one type of conventional flip chip type die 12 assembled to a package substrate 14. Flip chip die 12 has a circuit side 50 and a back side 40. The circuit side 50 includes a number of circuit devices formed near the circuit side in a portion of the die known as the epitaxial layer 22. The epitaxial layer 22 has a thickness in the range of 1 to 15 microns. The portion of the die shown above the epitaxial layer is known as the bulk layer 20. A plurality of solder bumps 26 are made on the circuit side 50 at pads 24. The solder bumps 26 are the inputs and outputs to the circuitry associated with the die 12. The flip chip type die 12 is attached to package substrate 14, such as a package for a flip chip via the solder bumps on the die 12. The package substrate 14 includes pads 16 that are arranged to correspond to the pattern of solder bumps on the die 12. The region between integrated circuit 12 and package substrate 14 is filled with an under-fill material 28 to encapsulate the solder bump connections and provide additional mechanical benefits. The pads 16 are coupled via circuitry to pads 18 on the package substrate. Solder bumps 30 are formed on the pads 18. The solder bumps 30 are the inputs and outputs to the circuitry associated with the package substrate 14. In another arrangement (not illustrated), the inputs and outputs to the circuitry associated with the package substrate 14 are implemented as pins rather than solder bumps.

For a flip chip type die such as die 12 of FIG. 1, failure analysis of a flip chip bonded IC can be accomplished using a global and/or local thinning process, such as mechanical polishing and laser microchemical etching, as previously discussed.

Figure 2:
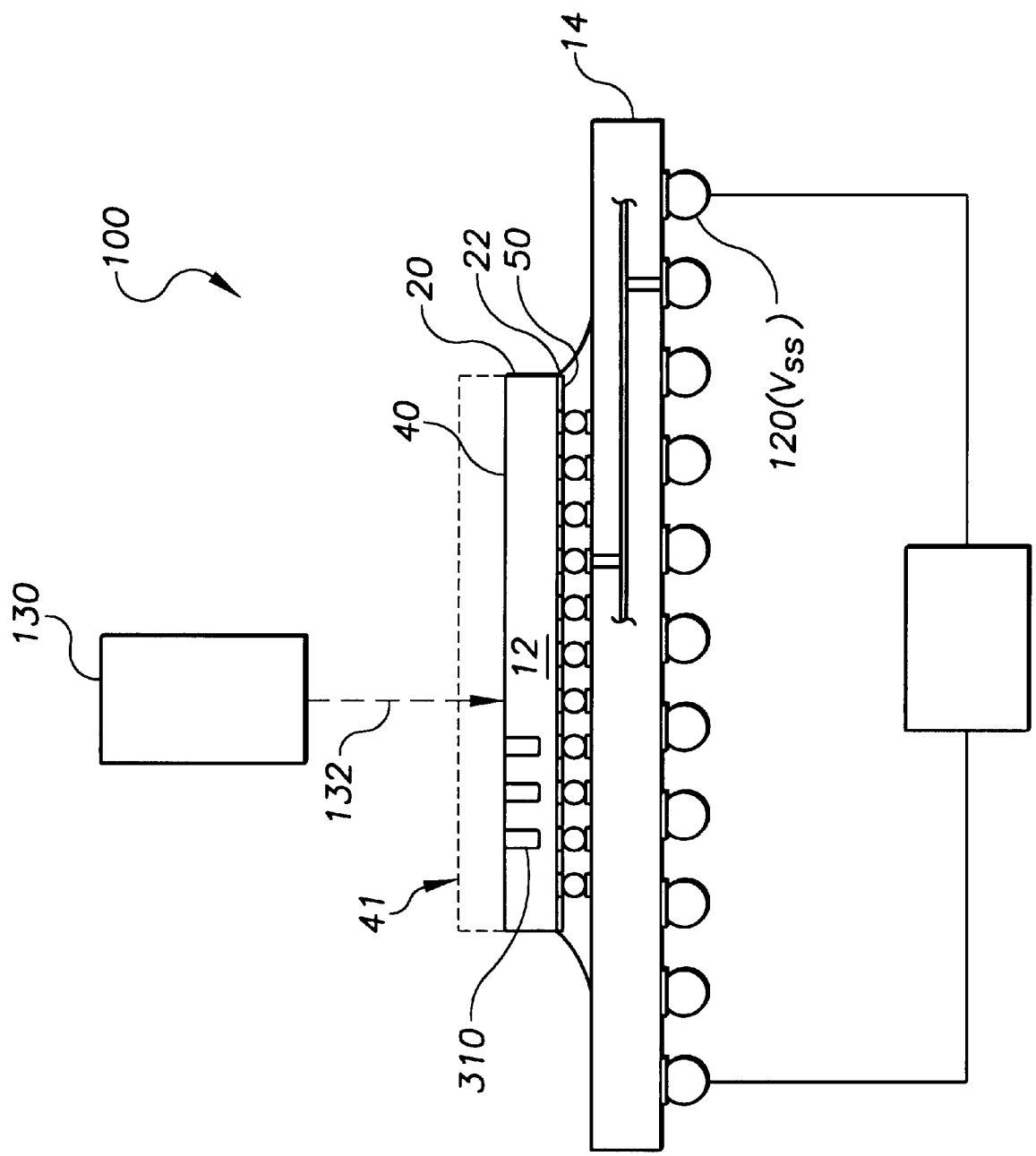
FIG. 2 shows a side view of the integrated circuit of FIG. 1 that has been globally thinned and has been implanted with several thermally conductive elements, according to one aspect of the present invention.

FIG. 2 shows a schematic view of an example process 100 for forming thermally conductive elements in a substrate 20 of a flip chip type die 12, as attached to a package substrate or surface 14. Substrate 20 has been globally thinned, as noted by dotted portion 41. After thinning, other electrical signal measurements can be made through the use of a test fixture that is adapted to permit a test connector to be connected directly to the test board that connects to test pins of the package. Reference is made to the following patent document for more information on testing, entitled "TEST ARRANGEMENT AND METHOD FOR A THINNED FLIP CHIP IC" (patent application Ser. No. 09/247,002, which is herein incorporated by reference.

The thinning of substrate 20 results in the removal of substrate material that is otherwise used for drawing heat away from the internal circuitry when the circuitry is running at high speeds. Thus, when the device under test is activated via the test fixture, the thinning process may result in there being insufficient material that would otherwise be used for drawing heat away from the internal circuitry while operating at high speeds. To compensate for the loss of heat-sink ability due to the thinning process, the structure of backside 40 of die 12 is implanted with thermally conductive elements that will help dissipate the heat. The focused ion beam apparatus 130 is used for implanting the conductive elements by producing a focused ion beam 132 of gallium ions that are implanted in substrate 20. FIG. 2 illustrates a partial formation of elements or probes 310 that are formed according to the teachings of the present invention.

Figure 3A:
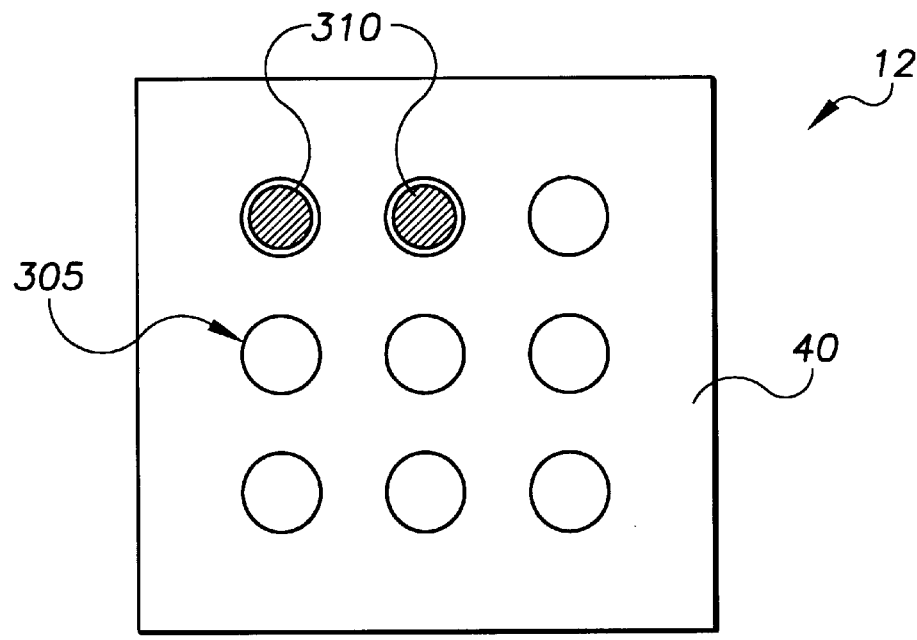
FIG. 3A shows a top view of the semiconductor device with a plurality of thermally conductive elements that have been implanted in the backside of the device and that dissipate heat, made according to the teachings of the present invention.
Figure 3B:
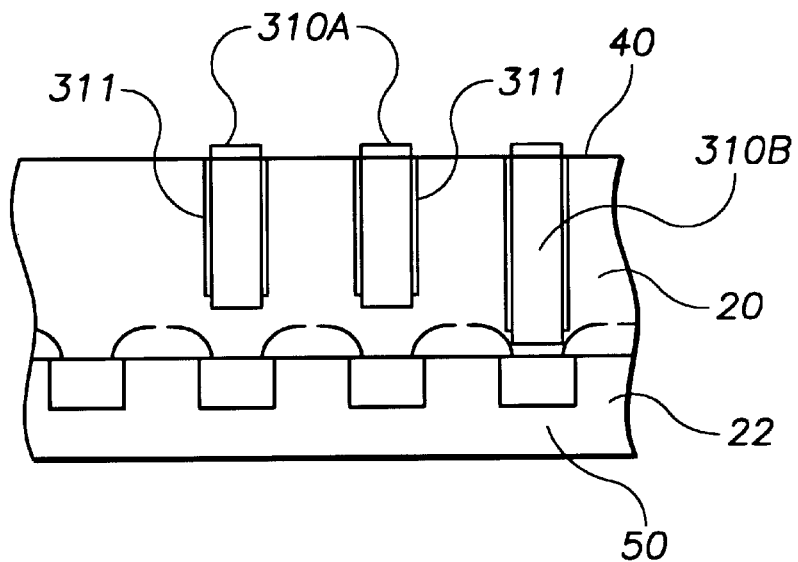
FIG. 3B shows cross-sectional view of a flip chip device with various thermally conductive elements that have been implanted in the backside of the device, according to an example embodiment of the present invention.

Referring to FIGS. 3A and 3B, there is shown a top view and a cross sectional view of die 12 that has probes 310 implanted therein. The probes in this example embodiment are made of Gallium (Ga+), but other suitable materials may be substituted. For details on forming one of the gallium probes, reference is made to patent document entitled "ARRANGEMENT AND METHOD FOR CHARACTERIZATION OF FIB INSULATOR DEPOSITION" (patent application Ser. No. 09/383,790), that is herein incorporated by reference. Referring briefly to FIGS. 2 and 3A, a narrow window 305 is milled from backside 40 using FIB 130. A gallium probe 310 is formed from gallium ion implantation from FIB 130 in the bulk silicon layer 20. A thermal conduit pathway to 'hot" or active areas are formed, as shown in FIG. 3B. As probes 310 are formed in the substrate, an insulative layer 311 is formed around the gallium probe that prevents it from electrically coupling with other devices in the die.

One of the advantages of the present invention is that one of the probes 310 can be used for analysis while the rest of the probes are dissipating heat from die 12 while it is running under test. In this example embodiment, a probe 310A is chosen to capacitively couple with an active area, without making physical contact that may damage the active device, thereby facilitating signal acquisition for failure analysis. For details reference is made to patent document entitled "PROBE GRID FOR INTEGRATED CIRCUIT ANALYSIS" (patent application Ser. No. 09/409,982), which is herein incorporated by reference. If this device is placed in a standard test fixture the heat sink device from the test fixture can now be eliminated since probes 310 will now be drawing heat from the backside of the device during operation. One of the thermally conductive probes 310 can be used as a probe, for instance such as probe 310B shown in FIG. 3B, for electrically coupling with an active device within the die. For details reference is made to patent document entitled "PROBE GRID FOR INTEGRATED CIRCUIT EXCITATION" (patent application Ser. No. 09/409,089), which is herein incorporated by reference.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

What is claimed is:

1. A method for testing a semiconductor device having a circuit side and a back side in the substrate, the method comprising:

thinning the semiconductor device and exposing a selected region in the semiconductor device at its back side;

forming a plurality of thermally conductive elements in the backside of the semiconductor device to facilitate testing via its circuit side; and activating the semiconductor device while using the thermal conductive elements to dissipate heat generated by the semiconductor device during a test procedure.

2. The method for testing a semiconductor device according to claim 1, wherein each of the thermally conductive elements includes an insulative layer disposed thereon, the insulative layer being in contact with the substrate.

3. The method for testing a semiconductor device, according to claim 2, wherein the insulative layer is formed as ions are implanted into the substrate via an ion beam.

4. The method for testing a semiconductor device, according to claim 3, wherein the ions are comprised of gallium (Ga+).

5. The method for testing a semiconductor device, according to claim 1, wherein thinning the semiconductor device and exposing a selected region in the semiconductor device at its backside includes using an etching tool.

6. The method for testing a semiconductor device according to claim 1, wherein thinning the semiconductor device and exposing a selected region in the semiconductor device at its back side includes using an focused ion beam device.

7. The method for testing a semiconductor device, according to claim 1, further including securing the semiconductor device in a test fixture and arranging the device for testing via its circuit side, after forming the conductive elements.

8. The method for testing a semiconductor device, according to claim 1, wherein at least one thermally conductive element is in contact with and electrically coupled to an active element in the semiconductor device, whereby the element is used for signal acquisition.

9. The method for testing a semiconductor device according to claim 1, wherein at least one thermally conductive element is capacitively coupled to an active element in the semiconductor device, whereby the element is used for signal acquisition.

10. The semiconductor device made according to the method of claim 1.

11. A method for dissipating heat in a semiconductor device, the device having a substrate with a backside and a circuit side with active devices thereon, comprising:

forming a plurality of thermally conductive probes in the backside of the semiconductor device; and activating the semiconductor device while using the thermally conductive probes to dissipate heat generated by the semiconductor device.

12. The method for dissipating heat in a semiconductor device according to claim 11, wherein each of the thermally conductive probes includes an insulative layer disposed thereon, the insulative layer being in contact with the substrate.

13. The method for testing a semiconductor device, according to claim 12, wherein the insulative layer is formed as gallium (Ga+) ions are implanted into the substrate via an ion beam.

14. The method for dissipating heat in a semiconductor device according to claim 13, wherein the probes are formed in an array.

15. The method for dissipating heat in a semiconductor device according to claim 11, further including thinning the semiconductor device and exposing a selected region in the semiconductor device at its backside, before forming the thermally conductive probes.

16. The method for dissipating heat in a semiconductor device according to claim 11, wherein at least one thermally conductive probe is in contact with and electrically coupled to an active element in the semiconductor device, whereby the probe is used for signal acquisition.

17. The method for dissipating heat in a semiconductor device according to claim 11, wherein at least one thermally conductive probe is capacitively coupled to an active element in the semiconductor device, whereby the probe is used for signal acquisition.

18. A test arrangement for a semiconductor device having a circuit side and a back side, comprising:

means for securing and testing the semiconductor device via the circuit side of the semiconductor device;

means for conducting heat generated by the semiconductor device while activated, the conducting means being formed in the semiconductor device, and wherein the means for securing and testing is adapted to test the semiconductor device while the semiconductor device is activated.

19. A test arrangement for a semiconductor device, according to claim 18, further including means for thinning the semiconductor device and for exposing a selected region in the semiconductor device at its back side.

20. A test arrangement for a semiconductor device, according to claim 18, wherein heat-conducting means further includes insulating means disposed thereon.

21. An arrangement for testing a semiconductor device having a circuit side and a back side in the substrate, the arrangement comprising:

means for thinning the semiconductor device and exposing a selected region in the semiconductor device at its back side;

means for forming a plurality of thermally conductive elements in the backside of the semiconductor device to facilitate testing via its circuit side; and means for activating the semiconductor device while using the thermal conductive elements to dissipate heat generated by the semiconductor device during a test procedure.

* * * * *